United States Patent
Ino et al.

(10) Patent No.: US 6,759,628 B1
(45) Date of Patent: Jul. 6, 2004

(54) LASER ANNEALING APPARATUS

(75) Inventors: Masumitsu Ino, Kanagawa (JP);
Toshikazu Maekawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 279 days.

(21) Appl. No.: 09/678,459

(22) Filed: Oct. 3, 2000

Related U.S. Application Data (62) Division of application No. 08/878,588, filed on Jun. 19, 1997, now Pat. No. 6,602,744.

(30) Foreign Application Priority Data

Jun. 20, 1996 (JP) .......................................... P8-181567

(51) Int. Cl.[7] .............................................. H01L 21/76
(52) U.S. Cl. ................................ 219/121.8; 219/121.65
(58) Field of Search ......................... 438/5, 7, 14, 164, 438/166, 487, 488; 219/121, 8, 121.65

(56) References Cited

U.S. PATENT DOCUMENTS

| | | | | |
|---|---|---|---|---|
| 5,382,548 A | * | 1/1995 | Lee | |
| 5,413,958 A | * | 5/1995 | Imahashi et al. | |
| 5,432,122 A | * | 7/1995 | Chae | |
| 5,496,768 A | * | 3/1996 | Kudo | |
| 5,528,372 A | * | 6/1996 | Kawashima | |
| 5,529,951 A | * | 6/1996 | Noguchi et al. | |
| 5,591,668 A | * | 1/1997 | Maegawa et al. | |
| 5,643,801 A | * | 7/1997 | Ishihara et al. | |
| 5,888,839 A | * | 3/1999 | Ino et al. | |
| 5,953,597 A | * | 9/1999 | Kusumoto et al. | |
| 6,002,101 A | * | 12/1999 | Yamazaki et al. | |

FOREIGN PATENT DOCUMENTS

| | | | |
|---|---|---|---|
| JP | 2-42717 A | * | 2/1990 |
| JP | 4-186725 A | * | 7/1992 |

* cited by examiner

*Primary Examiner*—Geoffrey S. Evans
(74) *Attorney, Agent, or Firm*—Sonnenschein, Nath & Rosenthal LLP

(57) ABSTRACT

A laser annealing apparatus for fabricating a thin film semiconductor device integratedly formed with thin film transistors each of which includes a semiconducting thin film formed on the surface of an insulating substrate spread in longitudinal and lateral directions and then crystallized. A band-shaped pulsed laser beam irradiates the insulating substrate along the longitudinal direction. The laser beam is simultaneously moved in the lateral direction with a specific movement pitch while partially overlapping regions irradiated with the laser beam. The movement pitch of the laser beam is set at a value equal to an arrangement pitch of the thin film transistors or at a value larger by a factor of an integer than the arrangement pitch. The insulating substrate is previously positioned such that the boundaries of the partially overlapped irradiated regions are not overlapped on a channel region of any of the thin film transistors.

6 Claims, 9 Drawing Sheets

FIRST LASER IRRADIATION | SECOND LASER IRRADIATION | THIRD LASER IRRADIATION | FOURTH LASER IRRADIATION

LASER ANNEALING APPARATUS

RELATED APPLICATION DATA

This application is a divisional of application Ser. No. 08/878,588 filed Jun. 19, 1997, now U.S. Pat. No. 6,602,744. The present and foregoing applications claim priority to Japanese application No. P08-181567 filed Jun. 20, 1996. All of the foregoing applications are incorporated herein by reference to the extent permitted by law.

BACKGROUND OF THE INVENTION

The present invention relates to a process of fabricating a thin film semiconductor device in which thin film transistors, each including as an active layer a semiconducting thin film formed on an insulating substrate, are integratedly formed. In particular, the present invention concerns a laser beam irradiation technique (laser annealing) for crystallization of a semiconducting thin film having formed on an insulating substrate.

Figure 10:
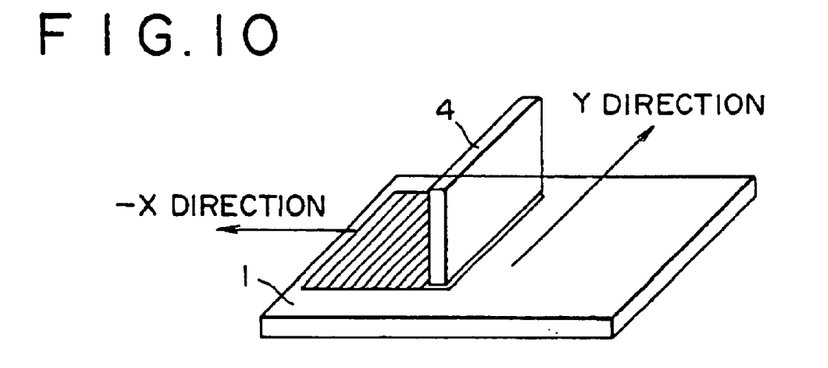
FIG. 10 is a schematic view showing a laser beam used for a related art laser beam irradiation process.

A laser annealing treatment using a laser beam has been developed as one of processes of fabricating a thin film semiconductor device at low temperatures. The laser annealing treatment includes steps of locally heating and melting a semiconducting thin film formed from a non-single crystal material such as amorphous silicon or polycrystalline silicon on an insulating substrate by irradiating a laser beam to the semiconducting thin film, and then crystallizing the semiconducting thin film in the cooling step. Thin film transistors, each including the semiconducting thin film thus crystallized as an active layer (channel region), are integratedly formed. Since the carrier mobility of the semiconducting thin film becomes higher by crystallization, characteristics of the thin film transistor including such a film can be improved. As shown in FIG. 10, in the laser annealing, a pulsed laser beam 4 formed in a band-shape along the longitudinal direction (Y direction) of an insulating substrate 1 is intermittently irradiated to the insulating substrate 1, and it is simultaneously moved relative to the insulating substrate 1 in the lateral direction (X direction) while partially overlapping regions irradiated with the laser beam 4 to each other. In the example shown in FIG. 10, the insulating substrate 10 is steppedly moved in the -X direction while the area irradiated with the laser beam 4 is fixed. The crystallization of a semiconducting thin film can be thus relatively uniformly performed by overlappingly irradiating the laser beam 4 to the semiconducting thin film.

Thin film semiconductor devices are suitable for drive substrates of active matrix type displays or the like, and in recent years they are being increasingly developed. In the case of using a thin film semiconductor device for a display, it is strongly required to enlarge the size of a transparent insulating substrate made of, for example, glass or the like and to reduce the cost thereof. In the example shown in FIG. 10, the insulating substrate 1 has dimensions of 400–500 mm in the X-direction and 300–400 mm in the Y-direction. To satisfy such requirements for enlargement in size and reduction in cost of a transparent insulating substrate, the laser annealing treatment using a laser beam has been adopted. That is, a semiconducting thin film can be crystallized at a relatively low temperature by irradiation of a laser beam thereto, and consequently a relatively inexpensive transparent insulating substrate made of low melting point glass or the like can be adopted. Thus, at present, a thin film semiconductor device integrally containing a peripheral circuit unit in addition to a display unit can be fabricated at low temperatures of 400° C. or less using bottom gate type thin film transistors. Further, a semiconducting thin film having a relatively large area can be efficiently converted from an amorphous phase into a polycrystalline phase by irradiating a band-shaped (linear) laser beam 4 to the semiconducting thin film while overlappingly scanning the laser beam 4. At the present time, an excimer laser is extensively used as a laser beam light source. The excimer laser, however, cannot make extremely larger the cross-section of the laser beam by the limited output power thereof. For this reason, a laser beam formed in a band-shape or linear shape is overlappingly scanned to be thus irradiated on the entire surface of a large-sized transparent insulating substrate made of glass or the like. In this case, however, upon scanning of the laser beam, particle sizes of crystals or the like of the semiconducting thin film become uneven by the influence of an energy distribution of the laser beam 4. This causes a problem in varying operational characteristics of drive thin film transistors integratedly formed in a display, thereby making it difficult to perform uniform display.

Figure 11:
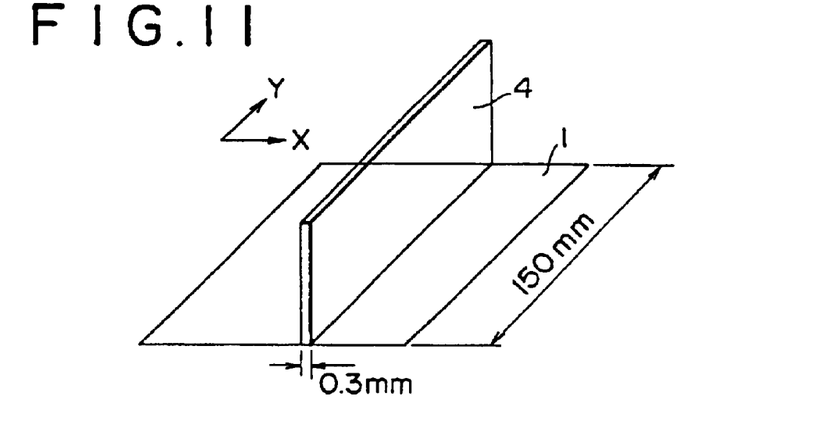
FIG. 11 is a schematic view showing a region irradiated with a laser beam according to the related art laser beam irradiation process.

In general, an excimer laser has an output power of about 200 W. As shown in FIG. 11, a laser beam 4 is formed in a band-shape for concentration of the power. In the example shown in FIG. 11, an area irradiated with the band-shaped laser beam 4 has dimensions of about 0.3 mm (300 μm) in the X direction and about 150 mm in the Y direction. Such a laser beam 4 is intermittently irradiated on the insulating substrate while being scanned along the x direction, to thereby recrystallize a semiconducting thin film formed on the entire surface of the insulating substrate.

Figure 12:
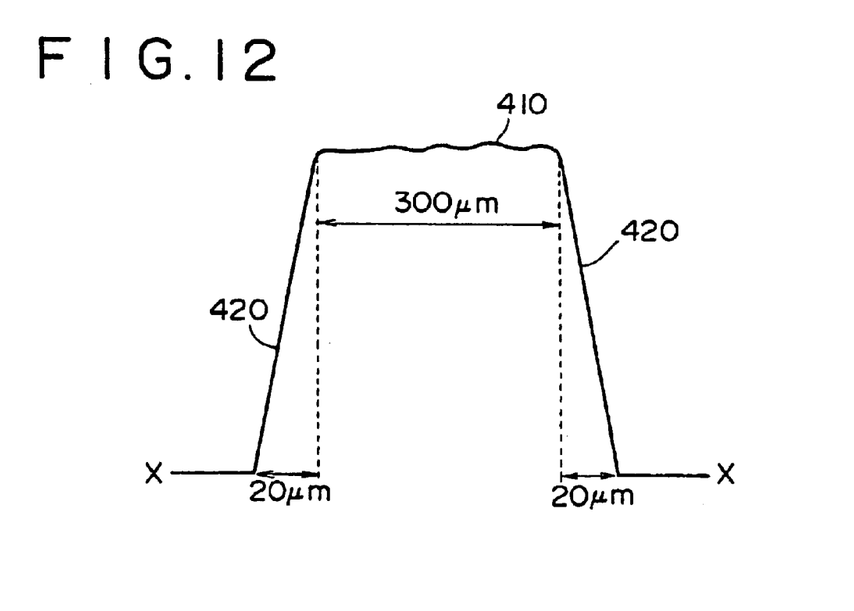
FIG. 12 is a schematic diagram showing an energy cross-sectional distribution of a laser beam.

FIG. 12 typically shows an energy distribution of the band-shaped laser beam 4 in the X direction (lateral direction). The energy distribution has an approximately parallelopiped profile composed of a flat section 410 at a central portion and tilted sections 420 on both sides thereof. The width of the flat section 410 is, for example, about 300 μm and the width of the tilted section is, for example, about 20 μm. The tilted section 420 is necessarily generated by action of an optic system used for forming the laser beam into a band-shape. The tilted sections 420 of the energy distribution of the laser beam 4 cause a variation in structure of a crystallized semiconducting thin film, resulting in crystal defects.

Figure 13:
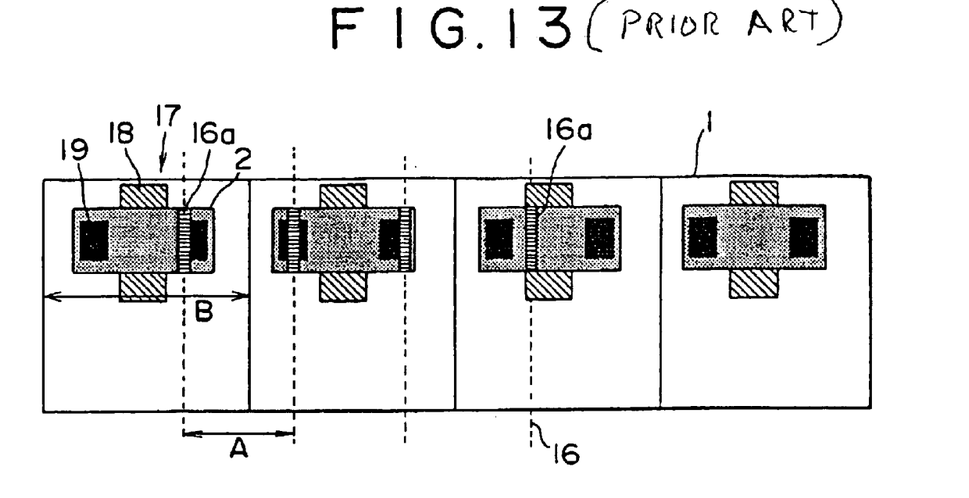
FIG. 13 is a schematic view showing overlapping irradiation of a laser beam according to the related art laser beam irradiation process.

FIG. 13 typically shows a state in which a laser beam is irradiated while being overlappingly scanned. In a related art laser annealing treatment, a pulsed laser beam is intermittently irradiated while it is scanned such that regions irradiated with laser beam are, for example, 90% overlapped. In the case where the width of the laser beam in the X-direction is 300 μm, the movement amount per one step of the intermittent irradiation becomes 30 μm. In the figure, the movement amount per one step is expressed by a movement step A. By repeating 10 times the intermittent irradiation of the laser beam with the movement amount pitch A, the laser beam is scanned 300 μm in width along the X direction. In this case, the tilted section of the cross-sectional profile of the laser beam is irradiated just at each boundary 16 of the partially overlapped regions irradiated with the laser beam, with a result that crystal defects 16a are generated along each boundary 16. On the other hand, thin film transistors 17 are integratedly formed on an insulating substrate 1 with a specific arrangement pitch B. In this example, the thin film transistor 17 is of a bottom gate type in which a semiconducting thin film 2 patterned into an island is overlapped on the gate electrode 18. A portion of the semiconducting thin film positioned directly over the gate electrode 18 constitutes a channel region, and contacts 19 are formed on both sides of the channel region. While FIG. 13 shows the thin film transistor 17 in a finished state, the laser annealing is performed at a suitable step of a process of fabricating the thin film transistor 17. Any relationship between the movement pitch A of the laser beam and the arrangement pitch B of the thin film transistors has been not examined. Consequently, there occurs a phenomenon that the crystal defects 16a formed for each boundary 16 are positioned in the channel region of one thin film transistor 17 but they are not positioned in the channel region of another thin film transistor 17.

Figure 14:
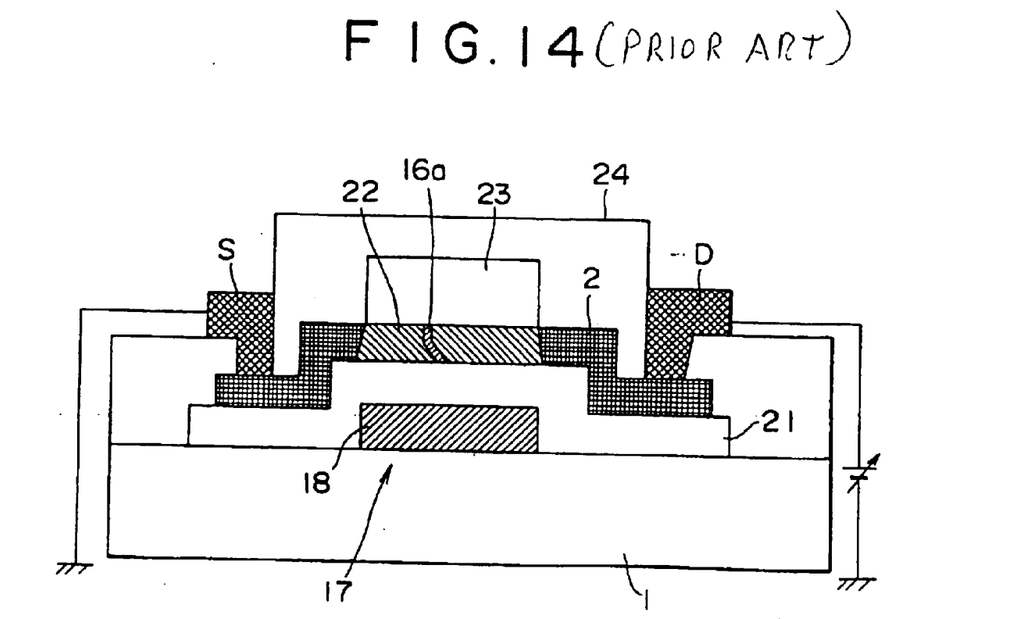
FIG. 14 is a sectional view showing one example of a related art thin film transistor.

FIG. 14 typically shows the cross-sectional structure of the thin film transistor 17 shown in FIG. 13, in which the gate electrode 18 is patterned on the insulating substrate 1 and the semiconducting thin film 2 is patterned on the gate electrode 18 through a gate insulating film 21. A stopper 23 aligned with the gate electrode 18 is formed on the semiconducting thin film 2. A portion directly under the stopper 23 constitutes a channel region 22. The thin film transistor 17 having such a bottom gate structure is covered with an interlayer insulating film 24. The interlayer insulating film 24 has contact holes through which a source electrode S and a drain electrode D are provided. Portions of the thin film transistor 2 brought in contact with the electrodes S, D are formed of, for example, $N^+$-type diffused layer. In the example shown in FIG. 14, the crystal defects 16a are present just in the channel region 22. The formation of the crystal defects 16a in the channel region 22 of the thin film transistor 17 degrades characteristics of the transistor, in particular, significantly reduces the current driving ability of the transistor. Accordingly, in the case where such a thin film transistor 17 is used as a switching element for a pixel, there occurs unevenness of display of the screen.

Figure 15:
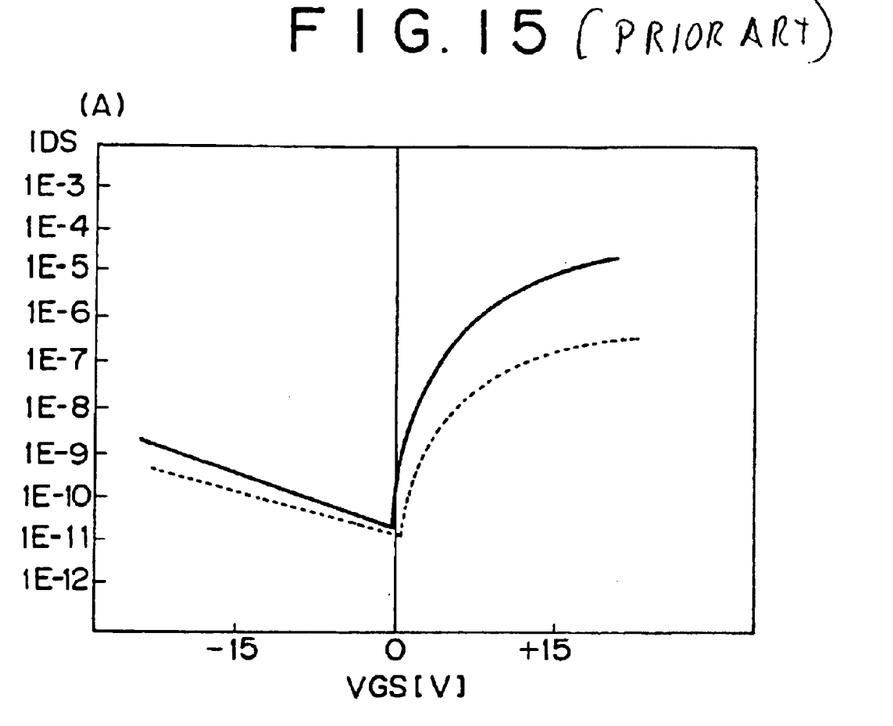
FIG. 15 is a graph showing electric characteristics of the related art thin film transistor.

FIG. 15 is a graph showing a relationship between a gate voltage VGS and a drain current IDS of a thin film transistor. In this graph, a curve indicated by a solid line shows a transistor characteristic of the thin film transistor containing no crystal defect in a channel region; while a curve indicated by a dot line shows a transistor characteristic of a thin film transistor containing crystal defects in a channel region. The graph of FIG. 15 shows that a thin film transistor containing crystal defects in a channel region is reduced in current driving ability and thereby deteriorated in characteristic of writing a video signal into a pixel. If a variation in operational characteristic of such a thin film transistor appears on a screen of an active matrix type display in the horizontal direction, there occurs an image failure such as a vertical streak.

Figure 16:
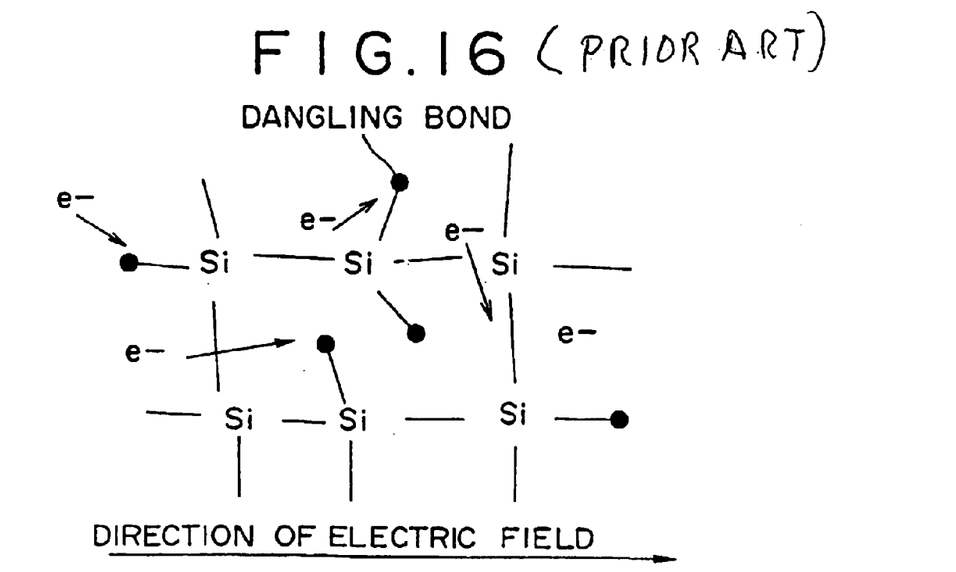
FIG. 16 is a schematic view showing a crystal structure of a semiconducting thin film crystallized by the related art laser annealing step.

FIG. 16 typically shows a cause of reducing the current driving ability of a thin film transistor. In the case where a semiconducting thin film made of silicon or the like is melted by laser annealing and is then solidified, the cooling of the film starts from an end portion of each region irradiated with the laser beam, and accordingly, dangling bonds of Si leading to crystal defects are formed after crystallization at each boundary of the partially overlapped regions irradiated with the laser beam. The crystal defect is a portion in which a bonding network of Si is disturbed, and contains a number of local levels. As a result, the crystal defect contains a number of traps of electric charges, to obstruct migration of electrons, thereby reducing the carrier mobility of the semiconducting thin film.

Although the overlapped amount of the laser beam formed in a band-shape is set at 90% in the above related art example, there may be considered a method of increasing the overlapped amount up to 95–99% for further improving the crystal state of a semiconducting thin film. Such a method, however, fails to basically improve the crystal state of a semiconducting thin film because if the overlapped amount is increased up to 95–99%, crystal defects possibly remain at each boundary of the irradiated regions. Japanese Patent Laid-open No. Hei 3-273621 discloses a technique that a laser beam is irradiated only to an element region. However, in this technique, it is impossible to perform the overlapping irradiation (multi-irradiation) of a laser beam, so that it is difficult to significantly improve the crystal quality of a semiconducting thin film present in the element region.

SUMMARY OF THE INVENTION

An object of the present invention is to provide a thin film semiconductor device characterized by enhancing electric characteristics of thin film transistors of the thin film semiconductor device by an improved laser annealing treatment.

To achieve the above object, according to a first aspect of the present invention, there is provided a process of fabricating a thin film semiconductor device, including the steps of: forming a semiconducting thin film on the surface of an insulating substrate spread in longitudinal and lateral directions; laser-annealing the semiconducting thin film by intermittently irradiating a pulsed laser beam formed in a band-shape along the longitudinal direction of the insulating substrate to the insulating substrate thereby crystallizing the semiconducting thin film; and integratedly forming thin film transistors, each including the semiconducting thin film as an active layer, with a specific arrangement pitch; wherein said laser annealing step further comprises a step of moving the laser beam relative to the insulating substrate in the lateral direction with a specific movement pitch while partially overlapping regions irradiated with the laser beam to each other, the movement pitch of the laser beam being set at a value equal to an arrangement pitch of the thin film transistors or at a value larger by a factor of an integer than the arrangement pitch of the thin film transistors. The laser annealing step is preferably performed such that any one of boundaries of the partially overlapped regions irradiated with the laser beam is not overlapped on a channel region of each of the thin film transistors.

According to a second aspect of the present invention, there is provided a laser annealing apparatus used for the above fabrication process, including means for intermittently irradiating a pulsed leaser beam formed in a band-shape along the longitudinal direction of the insulating substrate to the insulating substrate, and simultaneously moving the laser beam relative to the insulating substrate in the lateral direction with a specific movement pitch while partially overlapping regions irradiated with the laser beam to each other; means for setting the movement pitch of the laser beam at a value equal to an arrangement pitch of the thin film transistors or at a value larger by a factor of an integer than the arrangement pitch of the thin film transistors; and means for previously positioning the insulating substrate such that any one of boundaries of the partially overlapped irradiated regions is not overlapped on a channel region of each of the thin film transistors.

According to a third aspect of the present invention, there is provided a semiconductor device suitable for the above fabrication process, including: an alignment mark used for positioning said insulating substrate such that any one of boundaries of the partially overlapped irradiated regions formed on said insulating substrate is not overlapped on a channel region of each of said thin film transistors. The insulating substrate preferably includes a pixel electrode corresponding to each of said thin film transistors integratedly formed at a specific arrangement pitch. The thin film semiconductor device of the present invention is suitably used as a drive substrate of an active matrix type display.

According to the present invention, a band-shaped or linear-shaped laser beam is intermittently irradiated to an insulating substrate and it is simultaneously scanned while partially overlapping regions irradiated with the laser beam to each other, wherein the movement pitch of the laser beam is set at a value equal to an arrangement pitch of thin film transistors or at a value larger by a factor of an integer than the arrangement pitch of the thin film transistors. Accordingly, crystal states of the semiconducting thin film crystallized by the laser beam irradiation are distributed repeatedly at the same period as the movement pitch, and the repeated period of the crystal states corresponds to the arrangement pitch of the thin film transistors. As a result, portions of the semiconducting thin film constituting element regions of the thin film transistors integratedly formed on the insulating substrate have the crystal states being substantially similar to each other over the entire surface of the insulating substrate, so that there occurs no variation in operational characteristics of the thin film transistors. Further, according to the present invention, the insulating substrate is previously positioned such that any one of boundaries of the partially overlapped regions irradiated with the laser beam is not overlapped on a channel region of each thin film transistor, and consequently crystal defects present at the boundaries of the irradiated regions are not contained in the channel region of each thin film transistor and thereby all of the thin film transistors have adequately high current drive abilities.

BRIEF DESCRIPTION OF THE DRAWINGS

Other features and advantages of the invention will be apparent from the following description taken in conjunction with the accompanying drawings wherein.

DETAILED DESCRIPTION OF THE PREFERRED EMBODIMENTS

Figure 1A:
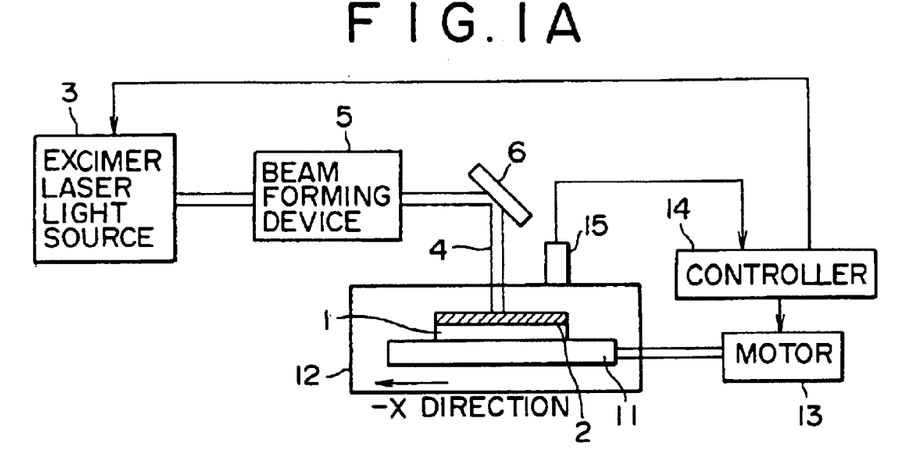
FIGS. 1A to 1C are schematic views showing a process of fabricating a thin film semiconductor device according to the present invention and a laser annealing apparatus used therefor.
Figure 1B:
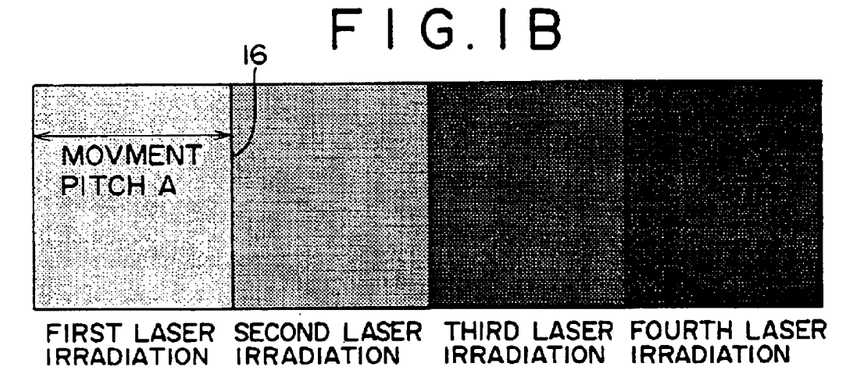
Figure 1C:
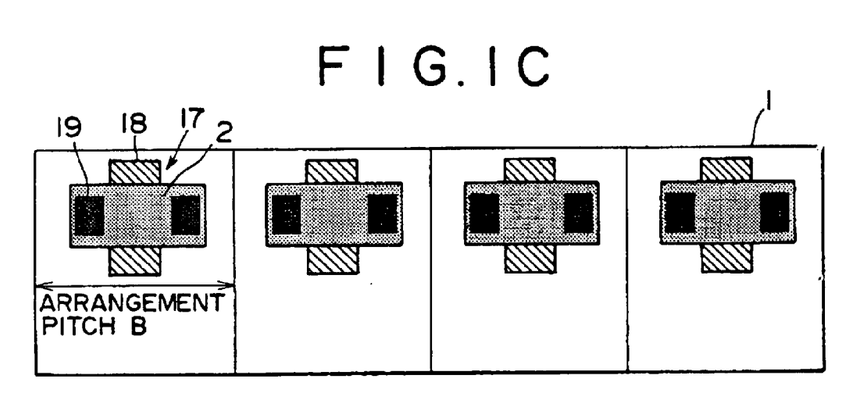

Hereinafter, a preferred embodiment of the present invention will be described with reference to the accompanying drawings. FIGS. 1A to 1C are schematic views showing a laser annealing step which is an essential step of a process of fabricating a thin film semiconductor device according to the present invention. FIG. 1A shows a laser annealing apparatus used for carrying out the laser annealing step. In the case of performing the laser annealing for crystallization of a semiconducting thin film, an insulating substrate 1 made of low melting point glass or the like is put in an annealing chamber 12 containing an XY stage 11. A semiconducting thin film 2 made of a non-single crystal material is previously formed on the surface of the insulating substrate 1. For example, the semiconducting thin film 2 is made of amorphous silicon by P-CVD. A laser beam 4 emitted from a XeCl excimer laser light source 3 is irradiated to the insulating substrate 1 disposed in the chamber 12, so that the semiconducting thin film 2 is melted once and is crystallized in the cooling step, with a result that the phase of the semiconducting thin film 2 is converted from amorphous silicon into polycrystalline silicon. The carrier mobility of the semiconducting thin film 2 becomes higher by the above crystallization, to thereby improve electric characteristics of a thin film transistor including the semiconducting thin film 2 as an active layer. The laser annealing apparatus has a beam forming device 5 for forming the cross-section of the laser beam 4 into a band-shape or linear shape and holding the uniformity of the cross-sectional energy intensity of the laser beam 4. The band-shaped laser beam 4, which has passed through the beam forming device 5, is reflected from a reflecting mirror 6, and is irradiated to the insulating substrate 1 contained in the chamber 12. In this case, more concretely, the pulsed laser beam 4 is intermittently irradiated to the insulating substrate 1, and the XY stage 11 is steppedly moved in the -X direction in synchronization with the intermittent irradiation of the pulsed laser beam 4. Thus, the pulsed laser beam 4 is moved relative to the insulating substrate 1 in the X direction (lateral direction) while partially overlapping regions irradiated with the laser beam 4 to each other. A motor 13 is mounted to the XY stage 11 for steppedly moving the stage 11 in the -X direction, and a controller 14 for synchronizing the intermittent irradiation of the laser beam 4 with the stepped movement of the stage 11 is interposed between the excimer laser light source 3 and the motor 13. In addition, the laser annealing apparatus includes a detector 15 for detecting an alignment mark (not shown) provided on the insulating substrate 1 and positioning the insulating substrate 1. An output of the detector 15 is supplied to the controller 14. The controller 14 drives the motor 13 on the basis of the detected result of the detector 15 to thereby position the insulating substrate 1.

FIG. 1B schematically shows the intermittent irradiation of the laser beam 4. The pulsed laser beam 4 formed in the band-shape along the longitudinal direction of the insulating substrate 1 is intermittently irradiated to the insulating substrate 1, and at the same time, the laser beam 4 is moved relative to the insulating substrate 1 in the lateral direction with a specific movement pitch A while partially overlapping regions irradiated with the laser beam 4 to each other. As is apparent from FIG. 1B, by repeating the laser beam irradiation several times while partially overlapping regions irradiated with the laser beam 4 to each other, each boundary 16 is formed between a preceding irradiated region and the following irradiated region partially overlapped on the preceding irradiated region. An interval between the adjacent boundaries 16 is equivalent to the movement pitch A.

FIG. 1C schematically shows thin film transistors 17 integratedly formed on the insulating substrate 1 with a specific arrangement pitch B, wherein each of the thin film transistors 17 includes the crystallized semiconducting thin film 2 as an active layer. As shown in FIG. 1C, the thin film transistor 17 is of a bottom gate type in which the semiconducting thin film 2 patterned into an island is overlapped on a gate electrode 18. A portion of the semiconducting thin film 2 positioned directly over the gate electrode 18 constitutes a channel region and contacts 19 are formed on both sides of the channel region. In addition, the laser annealing step is performed before or after patterning the semiconducting thin films 2 into the islands. From comparison of the view of FIG. 1C with the of FIG. 1B, it becomes apparent that in this embodiment, the movement pitch A of the laser beam 4 is set to be equal to the arrangement pitch B of the thin film transistors 17. In general, the movement pitch A may be set to be larger by a factor of an integer than the arrangement pitch B. Additionally, in this embodiment, the insulating substrate 1 is previously positioned such that any one of the boundaries 16 of the partially overlapped irradiated regions is not overlapped on a channel region of each thin film transistor 17. For this purpose, the laser annealing apparatus of this embodiment has the detector 15 for previously positioning the insulating substrate 1 so as to prevent any one of the boundaries 16 of the partially overlapped regions from being overlapped on a channel region of each thin film transistor 17. Further, an alignment mark (not shown), which is provided on the insulating substrate 1, is detected by the detector 15, and the insulating substrate 1 is positioned on the basis of the detected result. The laser annealing apparatus, as described above, has the stage 11, motor 13, and controller 14 as the moving means, so that when the pulsed laser beam 4 formed in the band-shape along the longitudinal direction of the insulating substrate 1 is intermittently irradiated to the insulating substrate 1, the laser beam 4 is moved relative to the insulating substrate 11 in the lateral direction with the specific movement pitch A while partially overlapping regions irradiated with the laser beam 4. The laser annealing apparatus also has the controller 14 as the means for setting the movement pitch A of the laser beam 4 at a value equal to the arrangement pitch B of the thin film transistors 17 or at a value larger by a factor of an integer than the arrangement pitch B of the thin film transistors 17.

Figure 2:
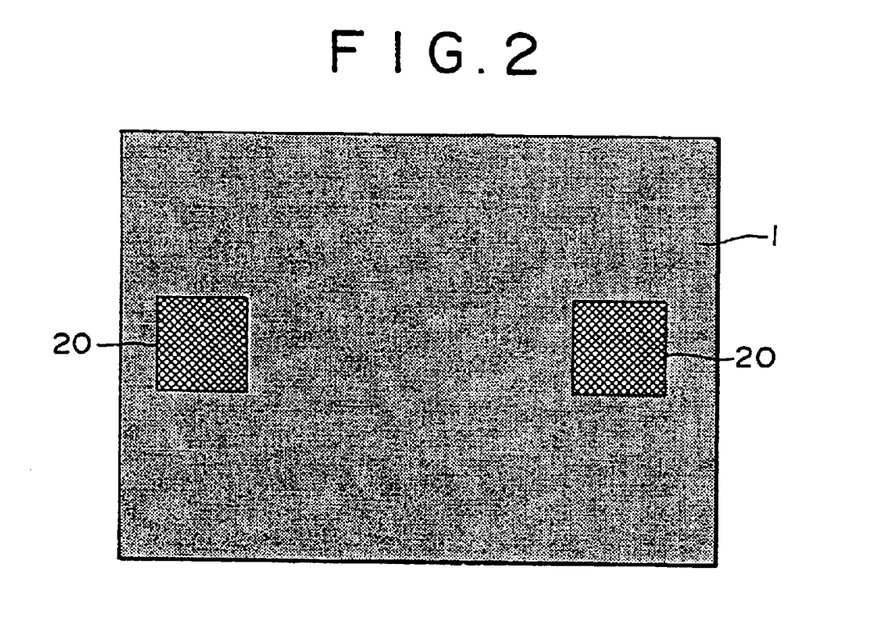
FIG. 2 is a schematic plan view showing alignment marks provided on a thin film semiconductor device.

FIG. 2 shows one example of alignment marks 20 provided on the insulating substrate 1. In this example, a pair of the rectangular alignment marks 20 are provided on the insulating substrate 1 right and left in the lateral direction. However, such provision of the alignment marks 20 is illustrative purposes only, and it is to be understood that many changes may be made with respect to the number and shape of the alignment marks 20.

Figure 3:
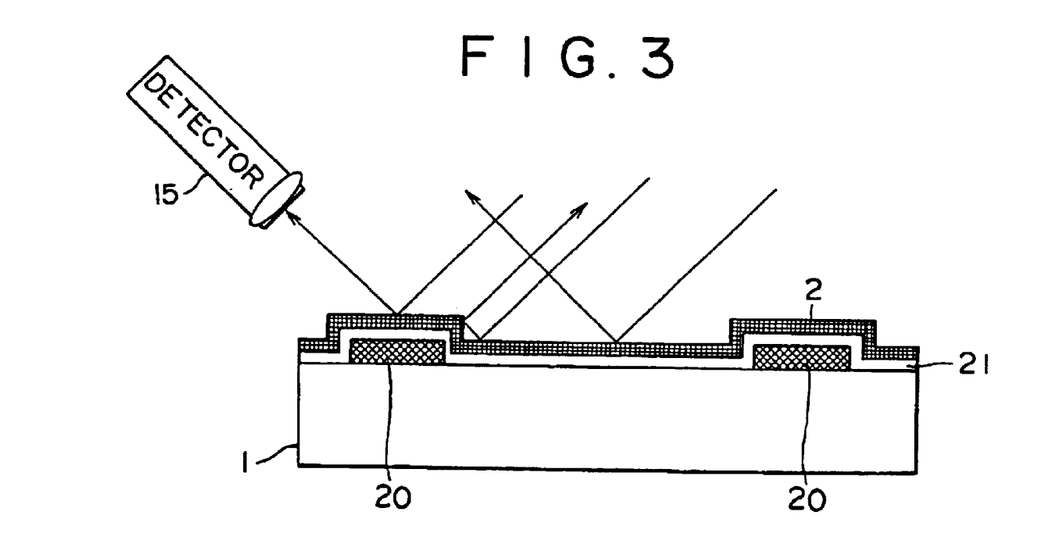
FIG. 3 is a schematic view showing a cross-sectional structure of the alignment marks shown in FIG. 2.

FIG. 3 shows a cross-sectional structure of the alignment marks 20 shown in FIG. 2. As shown in the figure, the alignment mark 20 is formed of a pattern of a metal film which is the same as a film constituting a gate electrode (not shown), and accordingly, the surface of each alignment mark 20 is covered with a gate insulating film 21 on which the semiconducting thin film 2 is formed. The alignment mark 20 is optically detected by a manner of obliquely irradiating light having a wavelength of, for example, 365 nm or 436 nm and detecting the amount of the light reflected from the alignment mark 20 by the detector 15. Since the amount of the reflected light is varied at a stepped portion of the alignment mark 20, the position of the alignment mark 20 can be determined by detecting the variation in the amount of the reflected light. The stage 11 is finely moved on the basis of the detected results supplied from the detector 15 up to a position where any one of the boundaries of the irradiated regions is not overlapped on a channel region of each thin film transistor. It is to be noted that the light having a wavelength of 365 nm or 436 nm can be supplied from the laser light source.

Figure 4:
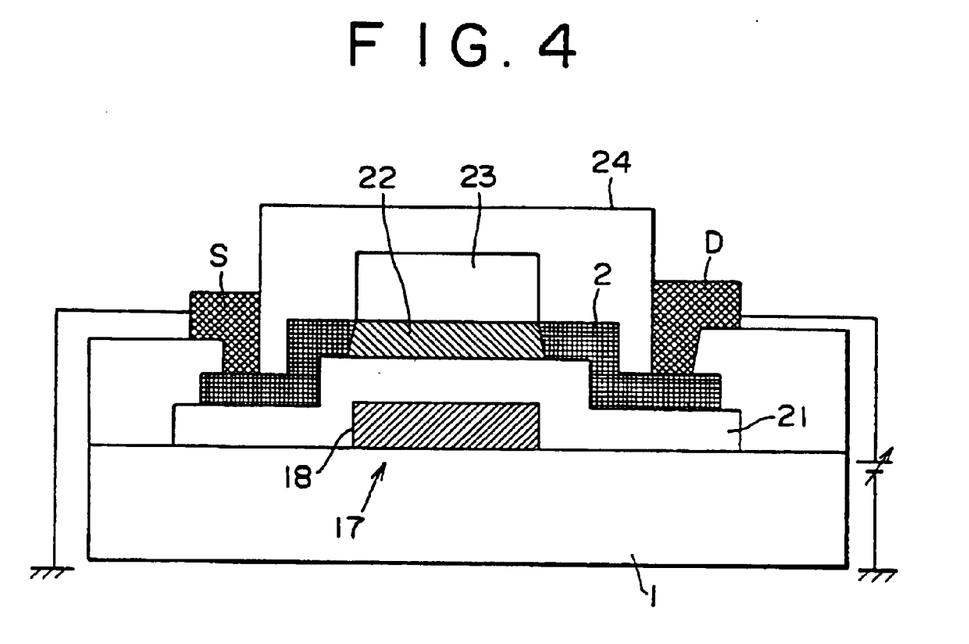
FIG. 4 is a schematic sectional view showing one example of a thin film transistor formed in accordance with the fabrication process of the present invention.

FIG. 4 is a schematic sectional view showing a cross-sectional structure of the thin film transistor 17 shown in FIG. 1C. The thin film transistor 17 is of a bottom gate type in which a gate electrode 18 is patterned on an insulating substrate 1 and a semiconducting thin film 2 is overlapped on the gate electrode 18 through a gate insulating film 21. A stopper 23 is provided on the semiconducting thin film 2 in alignment with the gate electrode 18. A portion of the semiconducting thin film 2 positioned directly over the stopper 23 constitutes a channel region, and regions ($N^+$-type region) heavily doped with an impurity are formed on both sides of the channel region 22. The thin film transistor 17 having such a configuration is covered with an interlayer insulating film 24, and a drain electrode D and a source electrode S are connected to the thin film transistor 17 through contact holes formed in the interlayer insulating film 24. From comparison of the view of FIG. 4 with the view of FIG. 14, it becomes apparent that the channel region 22 of the thin film transistor 17 of the present invention contains no crystal defect. This shows that the thin film transistor 17 has an adequately high current driving ability and thereby it can be suitably used, for example, for driving of a pixel electrode. In this embodiment, it is particularly important that channel regions of all of the thin film transistors 17 integratedly formed on the insulating substrate 1 do not contain crystal defects.

Figure 5:
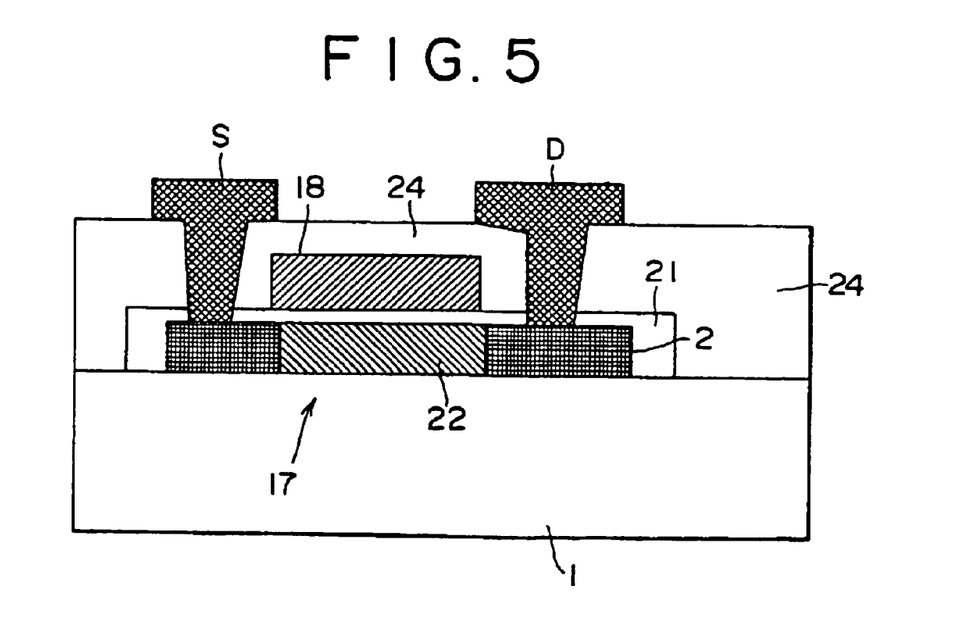
FIG. 5 is a schematic sectional view showing another example of the thin film transistor.

FIG. 5 is a schematic sectional view showing another example of the thin film transistor. The thin film transistor 17 shown in FIG. 5 is of a top gate type in which a semiconducting thin film 2 is patterned into an island on the surface of the insulating substrate 1 and a gate electrode 18 is patterned on the semiconducting thin film 2 through a gate insulating film 21. A portion of the semiconducting thin film 2 positioned directly under the gate electrode 18 constitutes a channel region 22. The channel region 22 does not contain crystal defects present at boundaries of partially overlapped regions irradiated with the laser beam. The thin film transistor 17 having such a configuration is covered with an interlayer insulating film 24 on which a drain electrode D and a source electrodes are formed. These electrodes are connected to $N^+$-type regions of the semiconducting thin film 2 through contact holes formed in the interlayer insulating film 24.

Figure 6:
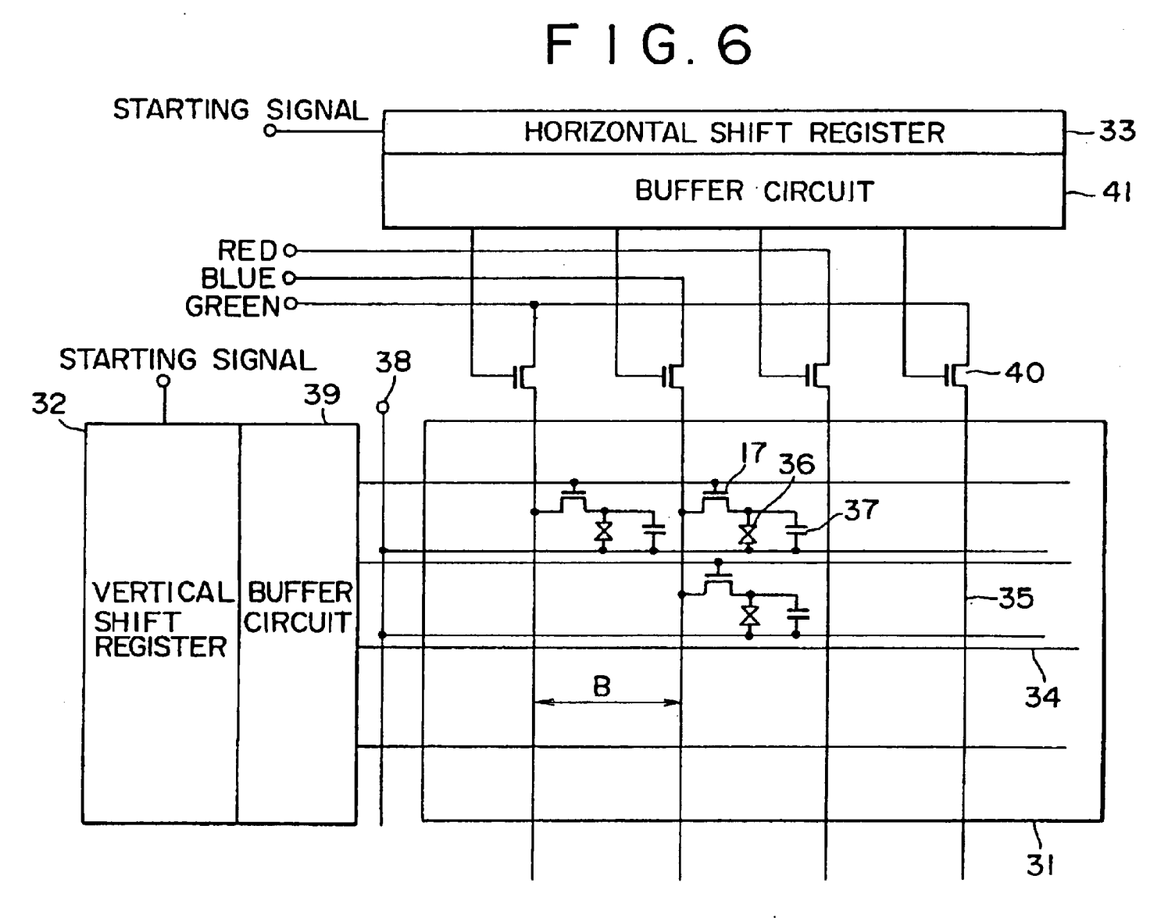
FIG. 6 is a schematic view showing one example of an active matrix type display including the thin film semiconductor device fabricated in accordance with the fabrication process of the present invention.

FIG. 6 is a schematic view showing one example of an active matrix type display using the thin film semiconductor device fabricated according to the present invention as a drive substrate. The example is of a peripheral circuit built-in type in which peripheral circuits such as a vertical shift register 32 and a horizontal shift register 33 are formed integrally with a display unit 31. The display unit 31 has gate lines 34 and signal lines 35 crossing the gate lines 34. A thin film transistor 17 for switching a pixel is formed at each of crossing portions between both the lines 34, 35. A source electrode of the thin film transistor 17 is connected to the corresponding signal line 35, the drain electrode thereof is connected to one-ends of a liquid crystal capacitance 36 and an additional capacitance 37, and the gate electrode is connected to the corresponding gate line 34. The other ends of the liquid crystal capacitance 36 and additional capacitance 37 are connected to a counter electrode 38. The thin film transistors 17 are integratedly formed with a specific arrangement pitch B equal to an interval between the signal lines 35 and also equal to an arrangement pitch of the liquid crystal capacitances 36 constituting pixels. On the other hand, the vertical shift register 32 operates on the basis of a starting signal supplied from the exterior, and sequentially outputs selective pulses to each gate line 34 via a buffer circuit 39, so that the liquid crystal capacitances 36 are selected for each row. Also, three color image signals RED, GREEN and BLUE are supplied from the exterior to each signal line 35 via a corresponding analog switch 40. The horizontal shift register 33 operates on the basis of a starting signal supplied from the exterior and sequentially opens/closes the analog switches 40 via a buffer circuit 41. Thus, image signals are sequentially sampled in the signal lines 35, and the selected liquid crystal capacitances 36 are written in a point-sequential manner. Each of the vertical shift register 32, horizontal shift register 33, and buffer circuits 39, 41 is formed of a thin film transistor. By integratedly forming these thin film transistors with the arrangement pitch B, the channel regions thereof can be free of crystal defects.

Figure 7:
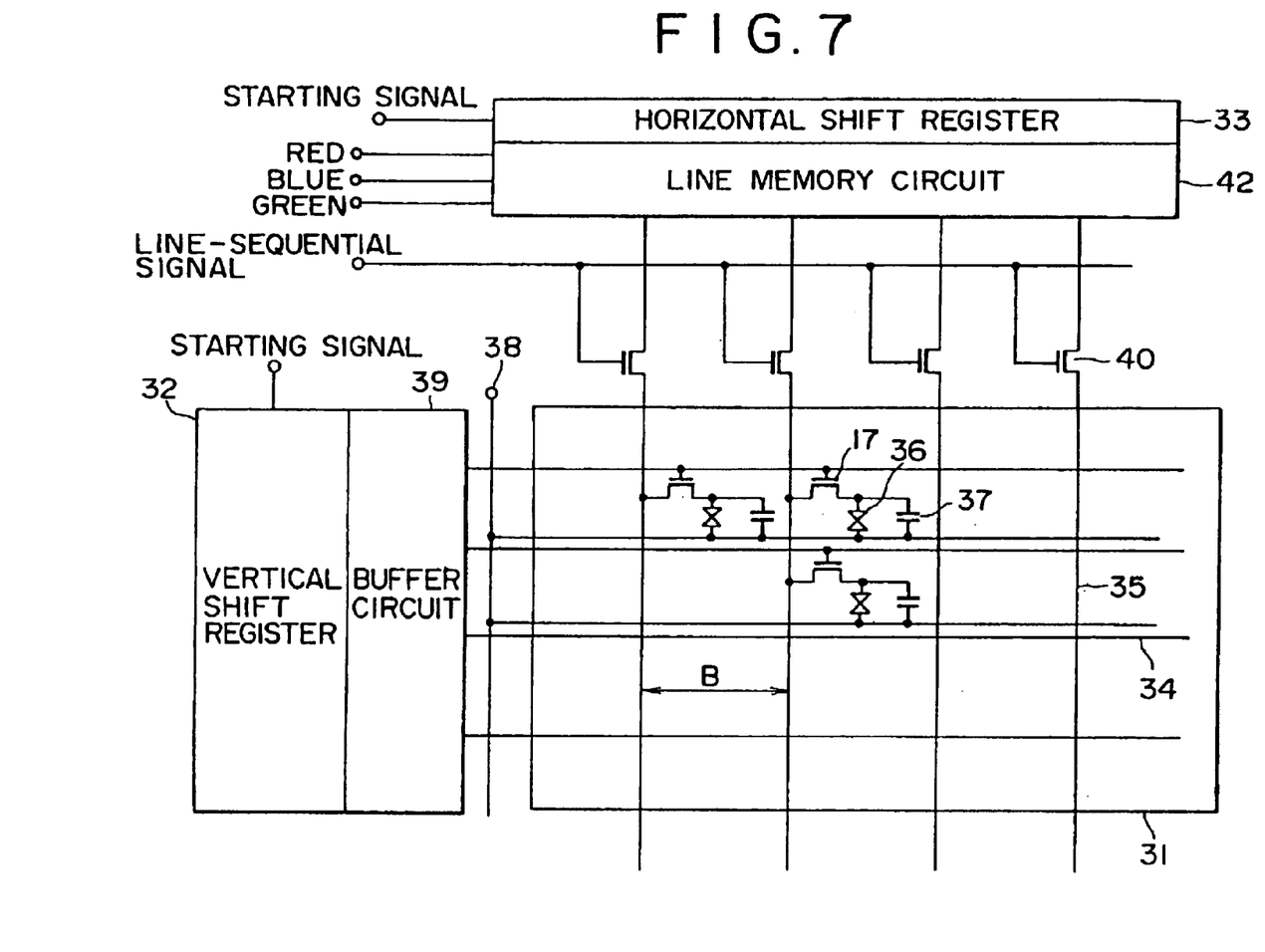
FIG. 7 is a schematic plan view showing another example of the active matrix type display.

FIG. 7 shows a modification of the active matrix type display shown in FIG. 6. For a clear understanding, parts corresponding to those shown in FIG. 6 are indicated by the same reference numerals. Although the example shown in FIG. 6 adopts a point-sequential scanning, the example shown in FIG. 7 adopts a line-sequential scanning using a line memory circuit 42 in place of the buffer circuit 41 shown in FIG. 6. Three color image signals RED, BLUE and GREEN are supplied to the line memory circuit 42, and are stored therein at a high speed for each line. Analog switches 40 connected to signal lines 35 are simultaneously opened/closed on the basis of a line-sequential signal supplied from the exterior, and image signals for one line stored in the line memory circuit 42 are simultaneously written in the liquid crystal capacitances 36 selected in a line-sequential manner for each line.

Figure 8:
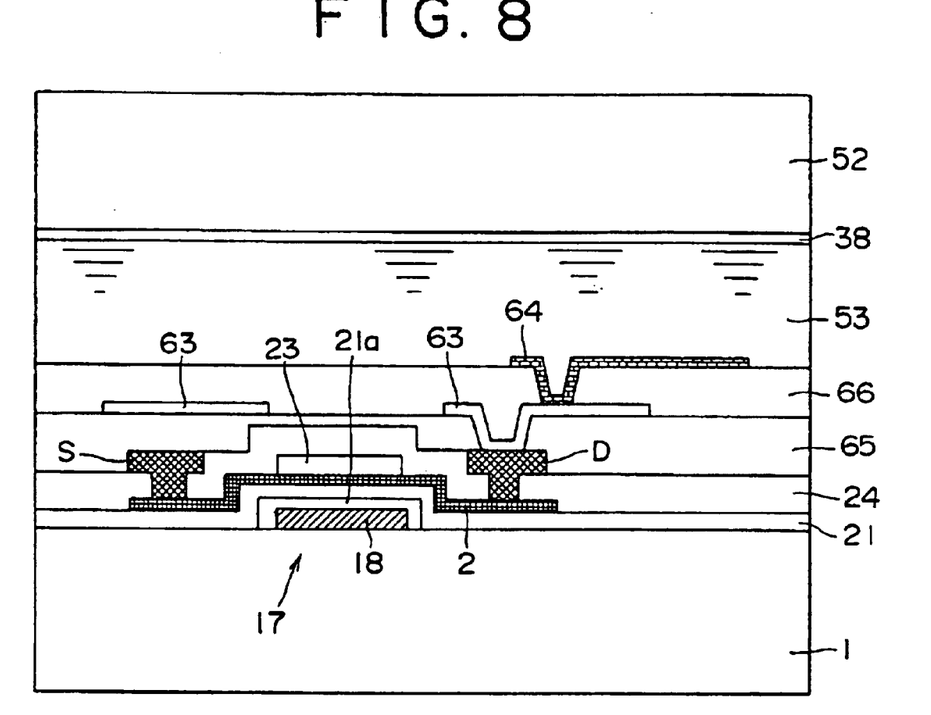
FIG. 8 is a sectional view showing one configuration example of the active matrix type display shown in FIG. 6.

FIG. 8 is a partial sectional view schematically showing a configuration example of the active matrix type display shown in FIG. 6. The display shown in FIG. 8 includes a drive substrate 1, a counter substrate 52 joined to the drive substrate 1 with a specific gap put therebetween, and liquid crystal 53 held in the gap therebetween. A counter electrode 38 is formed on the entire inner surface of the counter substrate 52. On the other hand, bottom gate type thin film transistors 17 are formed on the drive substrate 1. Each thin film transistor 17 includes a gate electrode 18 made of Mo/Ta or the like, a gate insulating film 21 made of P—$SiO_2$/P—Sin or the like, and a semiconductor thin film 2 made of polycrystalline silicon or the like, which are arranged in this order from bottom. The surface of the gate electrode 18 is covered with an anode oxidation film 21a such as $TaMo_x$ or the like, and a portion of the semiconducting thin film 2 positioned directly over the gate electrode 18 is covered with a stopper 23. The channel stopper 23 is made of, for example, P—$SiO_2$. The bottom gate type thin film transistor 17 having such a configuration is covered with a first interlayer insulating film 24 made of PSG or the like, and a source electrode S and a drain electrode D are formed from Mo or Al on the first interlayer insulating film 24 and are electrically connected to the thin film transistor 17 through contact holes formed in the first interlayer insulating film 24. These electrodes S, D are covered with a second interlayer insulating film 65 made of PSG or the like. A metal pattern 63 made of Ti or the like having a light shielding property is formed on the second interlayer insulating film 65, and is covered with a third interlayer insulating film 66 made of $SiO_2$ or the like having a light shielding property. A pixel electrode 64 made from ITO or the like is patterned on the third interlayer insulating film 66. The pixel electrode 64 is electrically connected to the thin film transistor 17 via the metal pattern 63 and the drain electrode D. The liquid crystal capacitance is composed of the liquid crystal 53 interposed between the pixel electrode 64 and the counter electrode 38.

Figure 9:
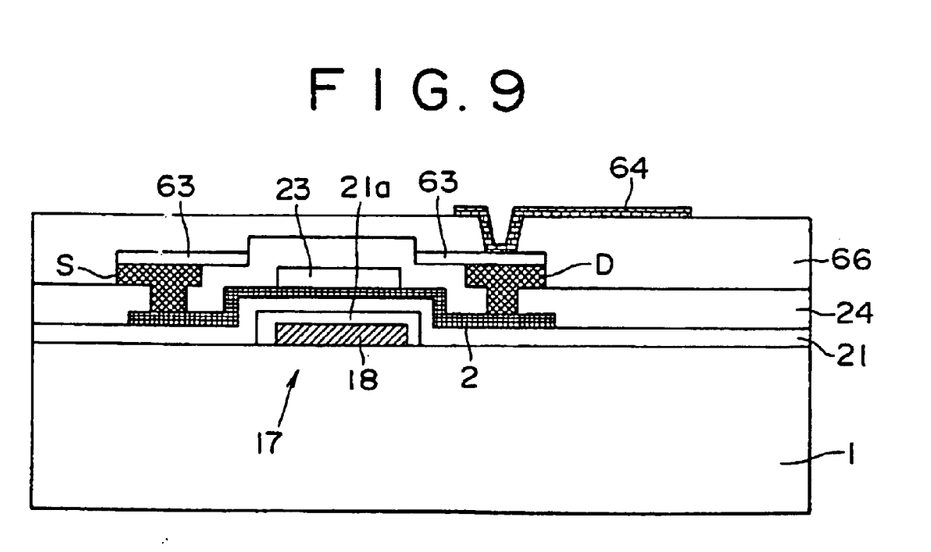
FIG. 9 is a partial sectional view showing another configuration example of the active matrix type display.

FIG. 9 shows a modification of the display shown in FIG. 8. The modification has the same basic configuration as that of the display shown in FIG. 8, except that the second interlayer insulating film 65 is omitted and the metal pattern 63 is brought in direct-contact with the electrodes S and D. In FIG. 9, parts corresponding to those shown in FIG. 8 are indicated by the same reference numerals for a clear understanding.

As described above, according to the present invention, a band-shaped laser beam is intermittently irradiated to an insulating substrate and at the same time the laser beam is moved relative to the insulating substrate in the lateral direction with a specific movement pitch while partially overlapping regions irradiated with the laser beam to each other, wherein the movement pitch of the laser beam is set at a value equal to the arrangement pitch of thin film transistors or at a value larger by a factor of an integer than the arrangement pitch of the thin film transistors. Further, according to the present invention, the insulating substrate is previously positioned such that any one of boundaries of the partially overlapped regions irradiated with the laser beam is not overlapped on a channel region of each thin film transistor. Accordingly, the thin film transistors having no variation in driving ability can be integratedly formed on the insulating substrate, and thereby they are effectively applicable to a drive substrate of an active matrix type display. The display using the thin film transistors of the present invention can prevent unevenness of a display screen due to the variation in driving ability of the thin film transistors. Additionally, since a channel region of each thin film transistor does not contain any crystal defect, the thin film transistor can be largely improved in current driving ability and thereby significantly improved in responsiveness thereof.

While the preferred embodiment of the present invention has been described using specific terms, such description is for illustrative purposes only, and it is to be understood that changes and variations may be made without departing from the spirit or scope of the following claims.

What is claimed is:

1. A laser annealing apparatus used for fabrication of a thin film semiconductor device integratedly formed with a plurality of thin film transistors each of which includes as an active layer a semiconducting thin film which is formed on a surface of an insulating substrate and then crystallized, comprising:

means for intermittently irradiating a pulsed laser beam formed in a band-shape along the longitudinal direction of the insulating substrate to the insulating substrate, and simultaneously moving the laser beam relative to the insulating substrate in the lateral direction with a specific movement pitch while partially overlapping regions irradiated with the laser beam to each other, the overlapped portions of the irradiated regions having a band shape along the longitudinal direction, the pulsed laser beam irradiating the semiconducting thin film effecting the semiconducting thin film to melt and then crystallize;

means for setting the movement pitch of the laser beam at a value equal to an arrangement pitch of the thin film transistors or at a value larger by a factor of an integer than the arrangement pitch of the thin film transistors; and means for previously positioning the insulating substrate such that any one of the boundaries of the overlapped portions of the irradiated regions is not overlapped on a channel region of each of the thin film transistors, wherein the any one of the boundaries of the overlapped portions of the irradiated regions is not overlapped on the channel region in the longitudinal direction and the lateral direction.

2. A laser annealing apparatus according to claim 1, wherein the laser beam is supplied from a laser light source.

3. A laser annealing apparatus according to claim 1, wherein said positioning means comprises a detector for irradiating light onto the surface of an alignment mark formed on the insulating substrate and detecting an amount of the light reflected from the surface of said alignment mark.

4. A laser annealing apparatus according to claim 3, wherein said light is supplied laser light source.

5. A laser annealing apparatus according to claim 1, wherein said moving means comprises a stage, a motor for moving said stage, and a controller for driving said motor.

6. A laser annealing apparatus according to claim 5, wherein said controller drives said motor on the basis of an output of a detector supplied to said controller, the detector is for irradiating light onto the surface of an alignment mark formed on the insulating substrate and detecting an amount of light reflected from the surface of the alignment mark.

* * * * *